US008890545B2

(12) United States Patent
Jamal et al.

(10) Patent No.: US 8,890,545 B2
(45) Date of Patent: Nov. 18, 2014

(54) MEASUREMENT OF TRANSISTOR GATE SOURCE CAPACITANCE ON A DISPLAY SYSTEM SUBSTRATE USING A REPLICA TRANSISTOR

(75) Inventors: Shafiq M. Jamal, Pleasanton, CA (US); Hopil Bae, Sunnyvale, CA (US); Sang Y Youn, Cupertino, CA (US); Wei H. Yao, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 150 days.

(21) Appl. No.: 13/610,729

(22) Filed: Sep. 11, 2012

(65) Prior Publication Data

US 2013/0328576 A1 Dec. 12, 2013

Related U.S. Application Data

(60) Provisional application No. 61/657,623, filed on Jun. 8, 2012.

(51) Int. Cl.
*G01R 27/26* (2006.01)

(52) U.S. Cl.
USPC .......................................................... 324/681

(58) Field of Classification Search
CPC ............... G01R 23/02; G01R 31/2862; G01R 31/2868; G01R 31/2879; G01R 31/2025; G01R 31/2851; G01R 31/3172; G01R 31/31905; G01R 31/31926; G01R 31/31713
USPC .................... 324/681, 76.39, 760.01–760.02, 324/762.01–762.1
See application file for complete search history.

(56) References Cited

U.S. PATENT DOCUMENTS 4,673,869 A * 6/1987 Michael ........................ 324/684
6,785,626 B2 * 8/2004 Corr ............................. 702/117

* cited by examiner

*Primary Examiner* — Tung X Nguyen
(74) *Attorney, Agent, or Firm* — Blakely, Sokoloff, Taylor & Zafman LLP

(57) ABSTRACT

Better performance can be provided for a display system that has semiconductor microelectronic components such as demultiplexors, gate line and data line drivers, and pixel switches formed on the display substrate, e.g., a glass substrate that constitutes part of an active matrix display panel. A gate source capacitance of a constituent transistor of one of these microelectronic components, e.g., a pixel thin film transistor (TFT) that is part of a particular display element, may be measured using a replica component that emulates the behavior of the component.

18 Claims, 8 Drawing Sheets

MEASUREMENT OF TRANSISTOR GATE SOURCE CAPACITANCE ON A DISPLAY SYSTEM SUBSTRATE USING A REPLICA TRANSISTOR

CLAIM OF PRIORITY

This application claims the benefit of U.S. Provisional Patent Application 61/657,623 entitled Measurement of Transistor Gate Source Capacitance on a Display System Substrate using a Replica Transistor, filed Jun. 8, 2012, the entire contents of which are incorporated herein by reference.

FIELD

An embodiment of the invention relates to circuitry for measuring the gate source capacitance of transistor devices on transparent substrates as part of a display system. Other embodiments are also described.

BACKGROUND

Flat panel displays such as liquid crystal display (LCD), plasma, and organic light emitting diode (OLED) are typically used in consumer electronics devices such as computer, gaming consoles, media players, and portable telephones, among others. A flat panel display contains an array of display elements that each receive a signal that represents the digital picture element to be displayed at that location of the respective element. This signal is referred to as a data value or data line signal and is applied to a carrier electrode of a thin film transistor (TFT) that is coupled to and integrated with the display element. Another carrier electrode of the transistor is connected to a display element charge storage circuit, e.g., a liquid crystal capacitor.

The TFT and its connected liquid crystal capacitor are referred to here as a "pixel." A signal at the control electrode of the transistor, referred to as a gate signal, modulates or turns on and off the transistor to apply the data line signal to the charge storage circuit which produces an analog pixel signal across the liquid crystal capacitor that controls the contribution of the particular connected display element to the overall display image.

Thousands or millions of copies of the display element including its associated TFT (e.g., an LCD cell and its associated field effect transistor, or an organic LED) are reproduced in the form of an array, on a transparent substrate such as a plane of glass or plastic. The array is overlaid with a grid of data lines and gate lines. The data lines serve to deliver the data signals to the carrier electrodes of the transistors and the gate lines serve to apply the gate signals to the control electrodes of the transistors. In other words, each of the data lines is coupled to a respective group of display elements, typically referred to as a column of display elements, while each of the gate lines is coupled to a respective row of display elements.

Each data line is coupled to a data line driver circuit that receives digital control and data signals from a signal generator. The latter translates incoming digital pixel values (for example, red, green and blue pixel values) into data signals (with appropriate timing). The data line driver then performs the needed voltage level shifting to produce a data line signal with the needed fan-out (current capability).

The display element, the switch element and the grid of data lines and gate lines are typically formed using microelectronic semiconductor processing techniques directly on the transparent substrate. This conserves space and allows for a direct and immediate connection for each of the millions of pixels. However, microelectronics formed on a glass substrate do not behave the same as those formed on a silicon substrate. The TFTs on the glass substrate have inconsistent performance and degrade quickly over time and with use. As a result, the quality, accuracy, and appearance of the display changes as the transistor behavior changes.

The changes can result in slow and inconsistent response times on the display as the TFT requires higher inputs to obtain the same response or as the TFT develops a capacitance or impedance that slows its reaction time. The degradation can also cause transient or even permanent changes in color as the response characteristics of the TFT for a particular color change over time and change differently from that of another color pixel. In the worst case, the pixel is "dead" and remains either on or off at all times as the TFT no longer responds to its gate signal

SUMMARY

Better performance can be provided for a display system that has semiconductor microelectronic components such as demultiplexors, gate line and data line drivers, and pixel switches formed on the display substrate, e.g., a glass substrate that constitutes part of an active matrix display panel. A constituent transistor of one of these microelectronic components, e.g., a pixel thin film transistor (TFT) that is part of a particular display element, may be characterized using the following technique.

In a normal mode of operation, a transistor drive circuit, e.g., a gate line driver, drives an original transistor and also a replica of the original transistor (that is also formed on the display substrate using the same manufacturing process.) Then, when a test mode is selected, the replica transistor becomes connected as a capacitor to the oscillation ring of a ring oscillator test circuit. The frequency of the ring oscillator is measured with and without the replica transistor capacitor and the two frequencies are compared to determine an indication of the gate source capacitance of the replica transistor.

A compensation facility in the transistor drive circuit is then signaled to adjust the voltage applied to the original transistor during normal mode, based on the gate source capacitance of the replica transistor. The normal mode of operation is then resumed (with the drive circuit having been adjusted.) The original transistor (as well as other similar, original transistors that are connected to the same drive circuit) is now driven in a way that compensates for the detected changes in the electrical characteristics of the replica.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like reference numerals indicate similar elements. It should be noted that references to "an" or "one" embodiment of the invention in this disclosure are not necessarily to the same embodiment, and they mean at least one.

FIG. 7B is an example circuit schematic of a test apparatus for a drain current test in accordance with an embodiment of the invention.

DETAILED DESCRIPTION

One or more specific embodiments will be described below. These described embodiments are provided only by way of example, and do not limit the scope of the present disclosure. Additionally, in an effort to provide a concise description of these exemplary embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments described below, the articles "a," "an," and "the" are intended to mean that there are one or more of the elements. The terms "comprising," "including," and "having" are intended to be inclusive and mean that there may be additional elements other than the listed elements. Moreover, while the term "exemplary" may be used herein in connection to certain examples of aspects or embodiments of the presently disclosed subject matter, it will be appreciated that these examples are illustrative in nature and that the term "exemplary" is not used herein to denote any preference or requirement with respect to a disclosed aspect or embodiment. Additionally, it should be understood that references to "one embodiment," "an embodiment," "some embodiments," and the like are not intended to be interpreted as excluding the existence of additional embodiments that also incorporate the disclosed features.

Figure 1:
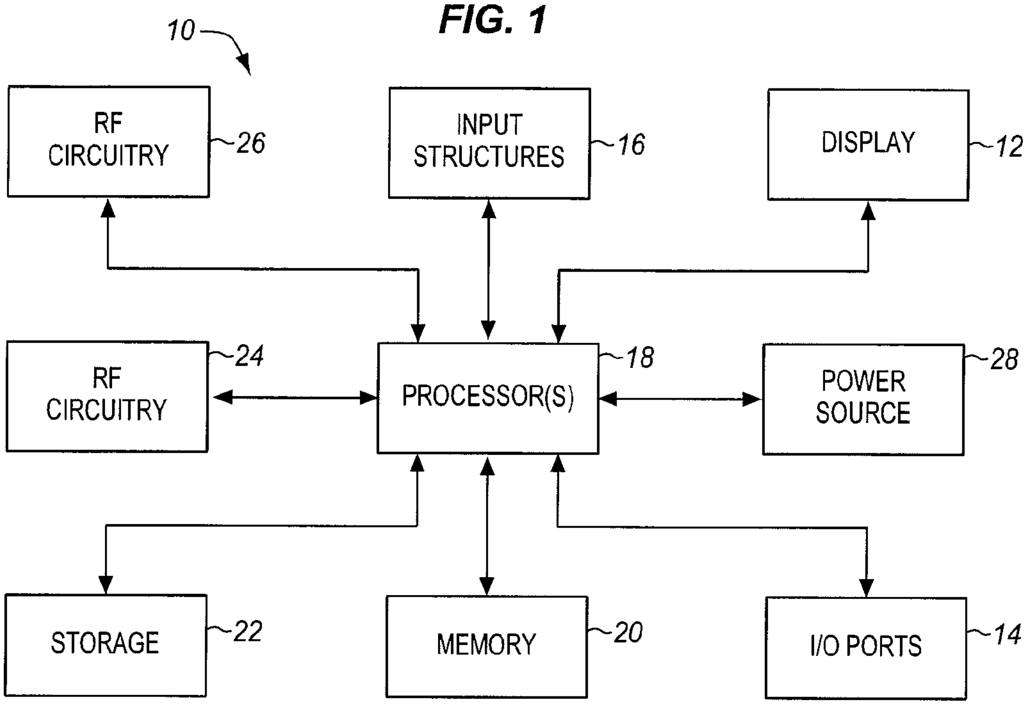
FIG. 1 is a block diagram of exemplary components of an electronic device that includes a display device, in accordance with an embodiment of the invention.
Figure 2:
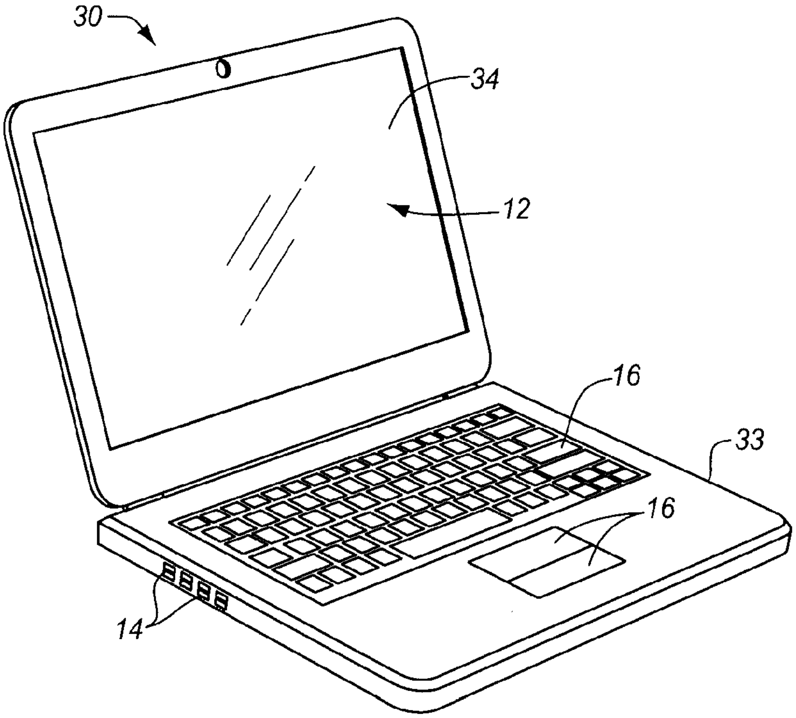
FIG. 2 is a perspective view of an electronic device in the form of a computer, in accordance with an embodiment of the invention.
Figure 3:
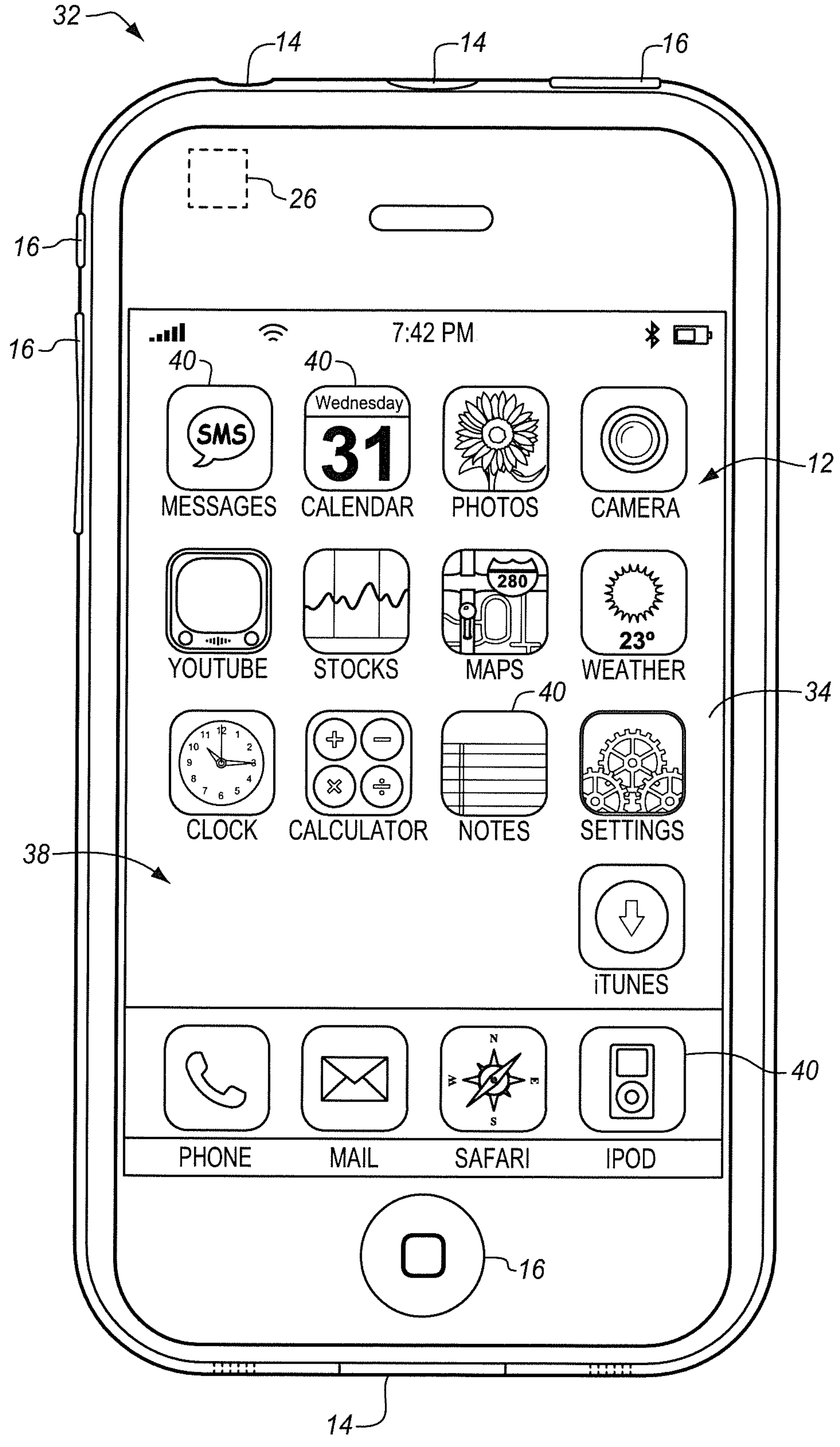
FIG. 3 is a front-view of a portable handheld electronic device, in accordance with an embodiment of the invention.
Figure 4:
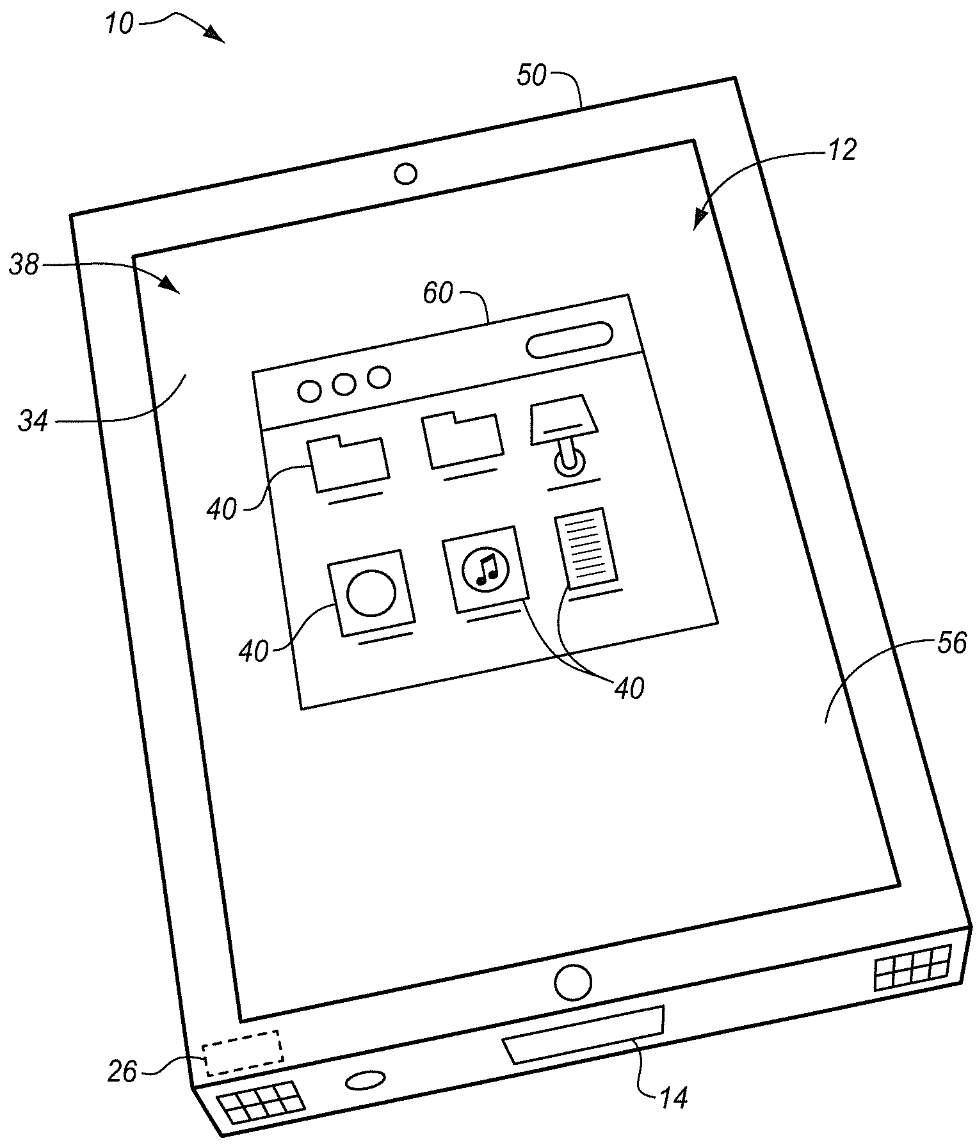
FIG. 4 is a perspective view of a tablet-style electronic device in accordance with an embodiment of the invention.

With the foregoing in mind, a general description of suitable electronic devices for performing these functions is provided below with respect to FIGS. 1-4. Specifically, FIG. 1 is a block diagram depicting various components that may be present in electronic devices suitable for use with the present techniques. FIG. 2 depicts an example of a suitable electronic device in the form of a computer. FIG. 3 depicts another example of a suitable electronic device in the form of a handheld portable electronic device. Additionally, FIG. 4 depicts yet another example of a suitable electronic device in the form of a computing device having a tablet-style form factor. These types of electronic devices, as well as other electronic devices providing comparable display capabilities, may be used in conjunction with the present techniques.

Keeping the above points in mind, FIG. 1 is a block diagram illustrating components that may be present in one such electronic device 10, and which may allow the device 10 to function in accordance with the techniques discussed herein. The various functional blocks shown in FIG. 1 may include hardware elements (including circuitry), software elements (including computer code stored on a computer-readable medium, such as a hard drive or system memory), or a combination of both hardware and software elements. It should be noted that FIG. 1 is merely one example of a particular implementation and is merely intended to illustrate the types of components that may be present in the electronic device 10. For example, in the illustrated embodiment, these components may include a display 12, input/output (I/O) ports 14, input structures 16, one or more processors 18, memory device(s) 20, non-volatile storage 22, expansion card(s) 24, RF circuitry 26, and power source 28.

The display 12 may be used to display various images generated by the electronic device 10. The display may be any suitable display such as a liquid crystal display (LCD), a plasma display, or an organic light emitting diode (OLED) display, for example. In one embodiment, the display 12 may be an LCD employing fringe field switching (FFS), in-plane switching (IPS), or other techniques useful in operating such LCD devices. The display 12 may be a color display utilizing a plurality of color channels for generating color images. By way of example, the display 12 may utilize a red, green, and blue color channel. The display 12 may include gamma adjustment circuitry configured to convert digital levels (e.g., gray levels) into analog voltage data in accordance with a target gamma curve. By way of example, such conversion may be facilitated using a digital-to-analog converter, which may include one or more resistor strings, to produce "gamma-corrected" data voltages.

In certain embodiments, the display 12 may include an arrangement of unit pixels defining rows and columns that form an image viewable region of the display 12. A source driver circuit may output this voltage data to the display 12 by way of source lines defining each column of the display 12. Each unit pixel may include a thin film transistor (TFT) configured to switch a pixel electrode. A liquid crystal capacitor may be formed between the pixel electrode and a common electrode, which may be coupled to a common voltage line ($V_{COM}$). When activated, the TFT may store image signals received via a respective data or source line as a charge in the pixel electrode. The image signals stored by the pixel electrode may be used to generate an electrical field between the respective pixel electrode and a common electrode. Such an electrical field may align liquid crystal molecules within an adjacent liquid crystal layer to modulate light transmission through the liquid crystal layer.

FIG. 2 illustrates an embodiment of the electronic device 10 in the form of a computer 30. The computer 30 may include computers that are generally portable (such as laptop, notebook, tablet, and handheld computers), as well as computers that are generally used in one place (such as conventional desktop computers, workstations, and servers). In certain embodiments, the electronic device 10 in the form of a computer may be a model of a MacBook™, MacBook™ Pro, MacBook Air™, iMac™, Mac™ Mini, or Mac Pro™, available from Apple Inc. of Cupertino, Calif. The depicted computer 30 includes a housing or enclosure 33, the display 12 (e.g., as an LCD 34 or some other suitable display), I/O ports 14, and input structures 16.

The display 12 may be integrated with the computer 30 (e.g., such as the display of a laptop or all-in-one computer) or may be a standalone display that interfaces with the computer 30 using one of the I/O ports 14, such as via a DisplayPort, DVI, High-Definition Multimedia Interface (HDMI), or analog (D-sub) interface. For instance, in certain embodiments, such a standalone display 12 may be a model of an Apple Cinema Display™, available from Apple Inc. As will be discussed below, the display 12 may include two or more common voltage lines and may be configured to reduce and/or compensate for errors that may be present between the kickback voltage associated with each of the two or more common voltage lines, thereby reducing the appearance of visual artifacts and/or improving color accuracy.

The electronic device 10 may also take the form of other types of devices, such as mobile telephones, media players, personal data organizers, handheld game platforms, cameras, and/or combinations of such devices. For instance, as generally depicted in FIG. 3, the device 10 may be provided in the form of a handheld electronic device 32 that includes various functionalities (such as the ability to take pictures, make telephone calls, access the Internet, communicate via email, record audio and/or video, listen to music, play games, connect to wireless networks, and so forth). By way of example, the handheld device 32 may be a model of an iPod™, iPod™ Touch, or iPhone™ available from Apple Inc.

In the depicted embodiment, the handheld device 32 includes the display 12, which may be in the form of an LCD 34. The LCD 34 may display various images generated by the handheld device 32, such as a graphical user interface (GUI) 38 having one or more icons 40. In another embodiment, the electronic device 10 may also be provided in the form of a portable multi-function tablet computing device 50, as depicted in FIG. 4. In certain embodiments, the tablet computing device 50 may provide the functionality of media player, a web browser, a cellular phone, a gaming platform, a personal data organizer, and so forth. By way of example, the tablet computing device 50 may be a model of an iPad™ tablet computer, available from Apple Inc.

The tablet device 50 includes the display 12 in the form of an LCD 34 that may be used to display a GUI 38. The GUI 38 may include graphical elements that represent applications and functions of the tablet device 50. For instance, the GUI 38 may include various layers, windows 60, screens, templates, or other graphical elements 40 that may be displayed in all, or a portion, of the display 12. As shown in FIG. 4, the LCD 34 may include a touch-sensing system 56 (e.g., a touchscreen) that allows a user to interact with the tablet device 50 and the GUI 38. By way of example only, the operating system GUI 38 displayed in FIG. 4 may be from a version of the Mac OS™ or iOS™ (e.g., OS X) operating system, available from Apple Inc.

Figure 5:
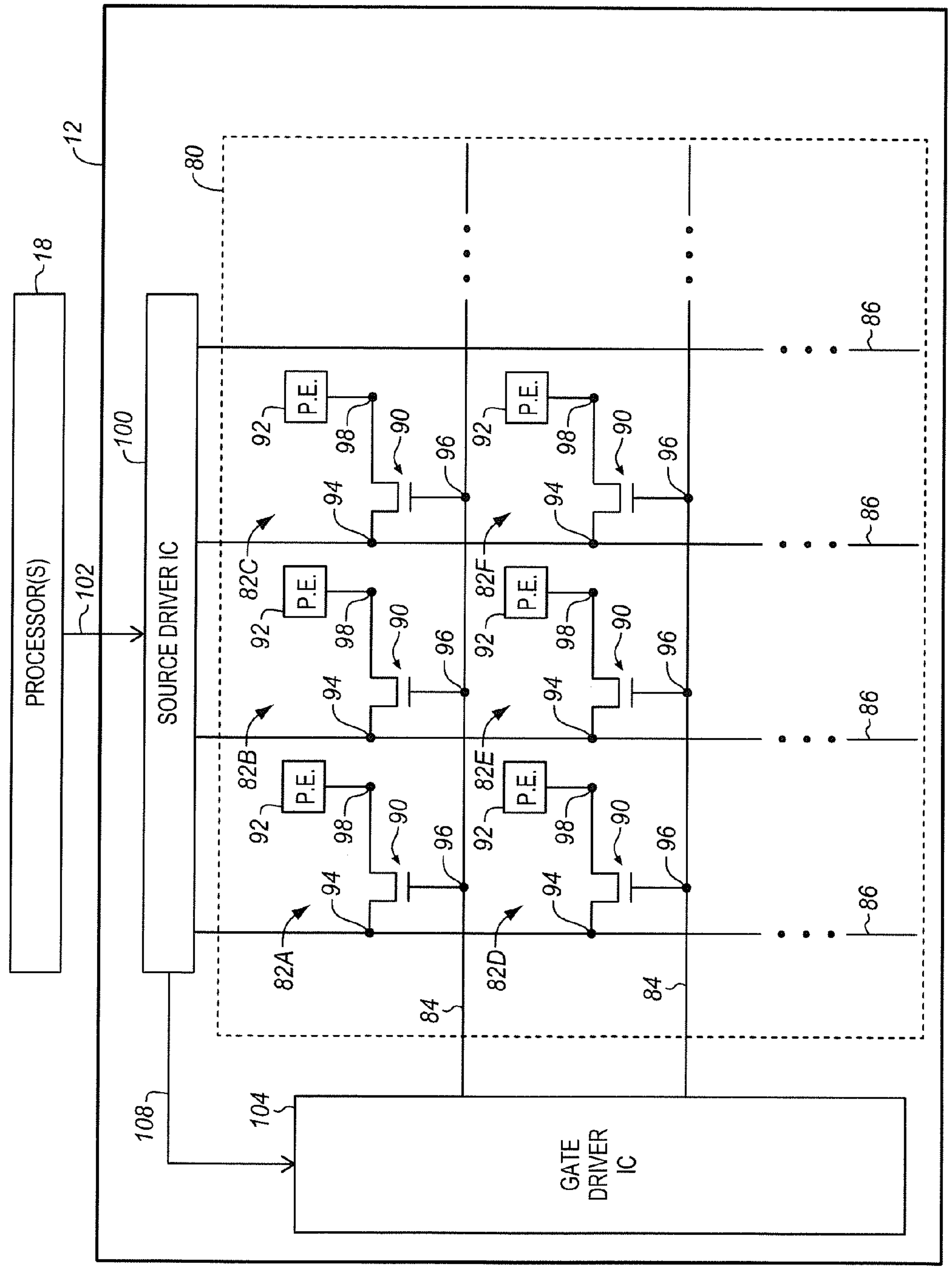
FIG. 5 is a circuit diagram illustrating the structure of unit pixels that may be provided in the display device of FIG. 1, in accordance with an embodiment of the invention.

Referring now to FIG. 5, a circuit diagram of the display 12 is illustrated, in accordance with an embodiment. As shown, the display 12 may include a display panel 80, such as a liquid crystal display panel (e.g., LCD 34 of FIG. 2). The display panel 80 may include multiple unit pixels 82 disposed in a pixel array or matrix defining multiple rows and columns of unit pixels that collectively form an image viewable region of the display 12. In such an array, each unit pixel 82 may be defined by the intersection of rows and columns, represented here by the illustrated gate lines 84 (also referred to as "scanning lines") and source lines 86 (also referred to as "data lines"), respectively.

Although only six unit pixels, referred to individually by the reference numbers 82*a*-82*f*, respectively, are shown for purposes of simplicity, it should be understood that in an actual implementation, each source line 86 and gate line 84 may include hundreds or even thousands of such unit pixels 82. By way of example, in a color display panel 80 having a display resolution of 1024×768, each source line 86, which may define a column of the pixel array, may include 768 unit pixels, while each gate line 84, which may define a row of the pixel array, may include 1024 groups of unit pixels, wherein each group includes a red, blue, and green pixel, thus totaling 3072 unit pixels per gate line 84. By way of further example, the panel 80 may have a display resolution of 480×320 or, alternatively, 960×640. As will be appreciated, in the context of LCDs, the color of a particular unit pixel generally depends on a particular color filter that is disposed over a liquid crystal layer of the unit pixel. In the presently illustrated example, the group of unit pixels 82*a*-82*c* may represent a group of pixels having a red pixel (82*a*), a blue pixel (82*b*), and a green pixel (82*c*). The group of unit pixels 82*d*-82*f* may be arranged in a similar manner.

As shown in the present embodiment, each unit pixel 82*a*-82*f* includes a thin film transistor (TFT) 90 for switching a respective pixel electrode 92. In the depicted embodiment, the source 94 of each TFT 90 may be electrically connected to a source line 86. Similarly, the gate 96 of each TFT 90 may be electrically connected to a gate line 84. Furthermore, the drain 98 of each TFT 90 may be electrically connected to a respective pixel electrode 92. Each TFT 90 serves as a switching element which may be activated and deactivated (e.g., turned on and off) for a predetermined period based upon the respective presence or absence of a scanning signal at the gate 96 of the TFT 90. For instance, when activated, the TFT 90 may store the image signals received via a respective source line 86 as a charge in its corresponding pixel electrode 92. The image signals stored by pixel electrode 92 may be used to generate an electrical field between the respective pixel electrode 92 and a common electrode (not shown in FIG. 5). As discussed above, the pixel electrode 92 and the common electrode may form a liquid crystal capacitor for a given unit pixel 82. Thus, in an LCD panel 80, such an electrical field may align liquid crystals molecules within a liquid crystal layer to modulate light transmission through a region of the liquid crystal layer that corresponds to the unit pixel 82. For instance, light is typically transmitted through the unit pixel 82 at an intensity corresponding to the applied voltage (e.g., from a corresponding source line 86).

The display 12 also includes a source driver integrated circuit (source driver IC) 100, which may include a chip, such as a processor or ASIC, that is configured to control various aspects of display 12 and panel 80. For example, the source driver IC 100 may receive image data 102 from the processor(s) 18 and send corresponding image signals to the unit pixels 82 of the panel 80. The source driver IC 100 may also be coupled to a gate driver IC 104, which may be configured to activate or deactivate rows of unit pixels 82 via the gate lines 84. As such, the source driver IC 100 may send timing information, shown here by reference number 108, to gate driver IC 104 to facilitate the activation and d deactivation of individual rows of pixels 82. In other embodiments, timing information may be provided to the gate driver IC 104 in some other manner. While the illustrated embodiment shows only a single source driver IC 100 coupled to panel 80 for purposes of simplicity, it should be appreciated that additional embodiments may utilize multiple source driver ICs 100 for providing image signals to the pixels 82. For example, additional embodiments may include multiple source driver ICs 100 disposed along one or more edges of the panel 80, wherein each source driver IC 100 is configured to control a subset of the source lines 86 and/or gate lines 84.

In operation, the source driver IC 100 receives image data 102 from the processor 18 or a discrete display controller and, based on the received data, outputs signals to control the pixels 82. For instance, to display image data 102, the source driver IC 100 may adjust the voltage of the pixel electrodes 92 (abbreviated in FIG. 2 as P.E.) one row at a time. To access an individual row of pixels 82, the gate driver IC 104 may send an activation signal to the TFTs 90 associated with the particular row of pixels 82 being addressed. This activation signal may render the TFTs 90 on the addressed row conductive. Accordingly, image data 102 corresponding to the addressed row may be transmitted from source driver IC 100 to each of the unit pixels 82 within the addressed row via respective data lines 86. Thereafter, the gate driver IC 104 may deactivate the TFTs 90 in the addressed row, thereby impeding the pixels 82 within that row from changing state until the next time they are addressed. The above-described process may be repeated for each row of pixels 82 in the panel 80 to reproduce image data 102 as a viewable image on the display 12.

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

In order to avoid the differences between semiconductors formed in silicon and semiconductors formed on glass, a silicon substrate is formed on a portion of the glass substrate that is not used for the display. Drivers, voltage controllers and other circuitry may be built on this silicon substrate. However, the display elements, such as charge storage circuits, e.g. liquid crystal capacitors, and their connected switch elements (TFTs) are still formed on the glass substrate.

Figure 6:
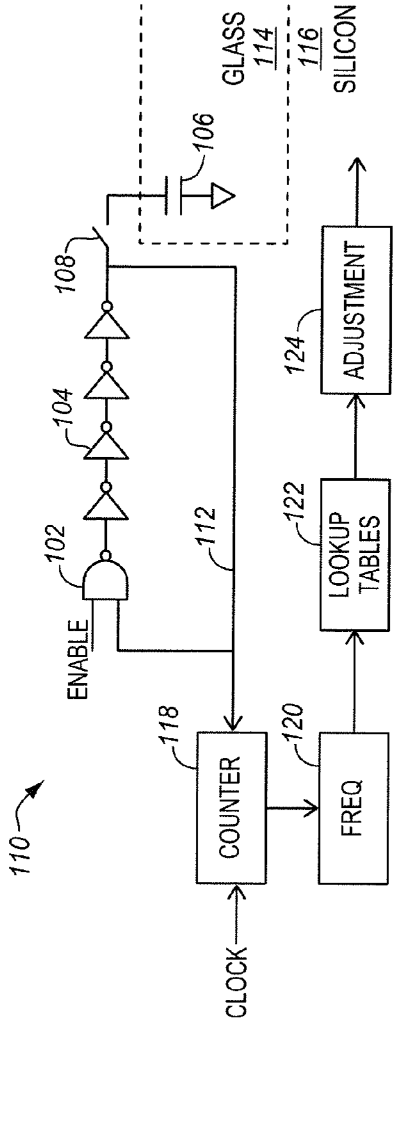
FIG. 6 is a circuit diagram of ring oscillator and frequency measurement system for determining a gate source capacitance of a replica transistor coupled as a capacitor to a ring oscillator, in accordance with an embodiment of the invention.

The gate source capacitance of a transistor affects the voltage that must be applied to the gate in order for the transistor to turn on or off. In accordance with an embodiment of the invention, the gate source capacitance of a replica transistor, which replicates an original switch element TFT of a pixel, that has been formed on a display panel substrate is measured, and then the gate voltage applied by the gate driver circuit of the display system to drive the original switch element TFT can be adjusted to compensate for changes in the gate source capacitance that have occurred over time. The gate source capacitance typically degrades over time so that the gate driver voltage is increased after different measurements are made. Alternatively the supply voltage can be lowered to compensate for the degradation of the gate source capacitance. FIG. 6 is a diagram of a switchable ring oscillation circuit 110 that may be used to determine the threshold gate voltage of a test transistor. The ring oscillation circuit has an oscillation ring formed by an odd number of delay gates 102, 104. The first delay gate 102 is a logical NAND with an enable input and a feedback from the end of the oscillation ring. The other delay elements 104 are inverters. As a pulse is produced from the NAND gate it is propagated with a delay through each inverter and reproduced at the input of the NAND gate. The NAND gate acts as an inverter that can be shut off using a second enable signal input. This allows the oscillator to be turned on or off. Alternatively another inverter may be used instead without an enable input.

Since there is an odd number of inverters, the output signal will be opposite in phase from the output of the NAND gate, this will cause the output of the NAND gate to reverse or change state. The frequency at which the NAND gate and the output changes states or oscillates depends on the total delay through the ring. In an oscillation ring composed of MOSFET transistors, the primary source of the delay is the inherent capacitance of each inverter. The inverter does not propagate the change of state at its output until its capacitance is charged by its input signal.

The output 112 of the oscillation ring, which is also the feedback input to the NAND gate, is supplied to a counter 118. The counter can count each transition in phase or state and compare it to an input clock. This count can then be supplied to a frequency measurement block 120 to determine the frequency of the ring oscillator.

The ring oscillator has a switch 108 to allow a capacitor 106 to be coupled to the oscillation ring output. As shown the switch 108 is open. This is the normal oscillation frequency mode. If the switch is closed, then the capacitor is added to the oscillation ring output 112. One side of the capacitor is coupled to the ring output 112 and the other side is grounded or coupled to a reverse polarity. The added capacitor changes the frequency of the oscillation ring as a function of its capacitance. By comparing the frequency of the oscillation ring with and without the added capacitor, the capacitance of the added capacitor can be determined. Since this capacitance is the gate source capacitance of the replica transistor, the gate source capacitance of the replica transistor is determined by this circuit using the switch 108.

The output line 112 of the ring oscillator 110 is coupled to the counter 118 and the frequency measurement 120, as mentioned above. The frequency measurement block 120 can compare the two frequencies to determine a difference, sum, or other comparative value. This is applied to look up tables 122 to determine adjustment parameters 124. The adjustment parameters are provided on an adjustment line 126 and can be applied to gate line or source line drivers of a display driver or to other components, depending on the application.

Figure 7A:
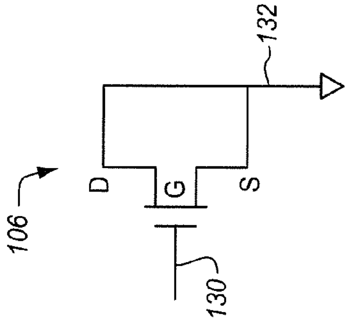
FIG. 7A is a circuit diagram of an example capacitor for use with the oscillation ring of FIG. 6.
Figure 7B:
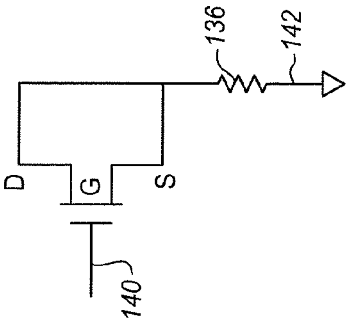
FIG. 7B is a circuit diagram of a second example of a capacitor for use with the oscillation ring of FIG. 6.

The capacitor includes a replica transistor as described in more detail in FIGS. 7A and 7B. The capacitor 106 with the replica transistor is formed on a glass substrate 114, while the rest of the logic 102, 104, 108 is formed on a silicon substrate 116. Alternatively, only a part of the capacitor may be formed on the glass substrate. This allows the replica transistor to emulate the behavior of other transistors formed on glass and it allows the other logic to be formed without the drawbacks for using a glass substrate. The particular way in which the replica transistor is formed on the glass substrate can be better understood as described below.

FIG. 7A shows an example of a capacitor 106 that includes the replica transistor. The transistor in this example is an n-type field effect transistor, such as a TFT formed on a glass substrate, which has a source S, a drain D and a gate G. The gate is used as one side 130 of the capacitor and is coupled to the oscillator ring. The source and drain are both grounded directly or through a load 136 as shown in FIG. 7B or coupled to an opposite polarity (or return node) of the power supply. The node 132 between the source and drain represents the other side of the capacitor. The replica transistor can be formed on the glass substrate 114 while the load and the input 130 are formed on the silicon substrate. The precise use of the different substrates may be modified to suit different applications.

FIG. 7B shows an alternative approach to forming the capacitor which includes a discrete load 136 instead of relying on the inherent resistance of the replica transistor. The gate side of the capacitor 140 is coupled to the oscillation ring and the drain source node coupled to the load 136 represents the other side 142 of the capacitor.

While two different capacitor designs are shown, the invention is not so limited. Different capacitor designs and different variations on the illustrated designs may be used. More components may be added to form the capacitor and may be formed on the glass or the silicon substrate to suit particular design objectives. Similarly more of the ring oscillator and supporting components may be formed on the glass substrate than is shown in FIG. 6.

Figure 8:
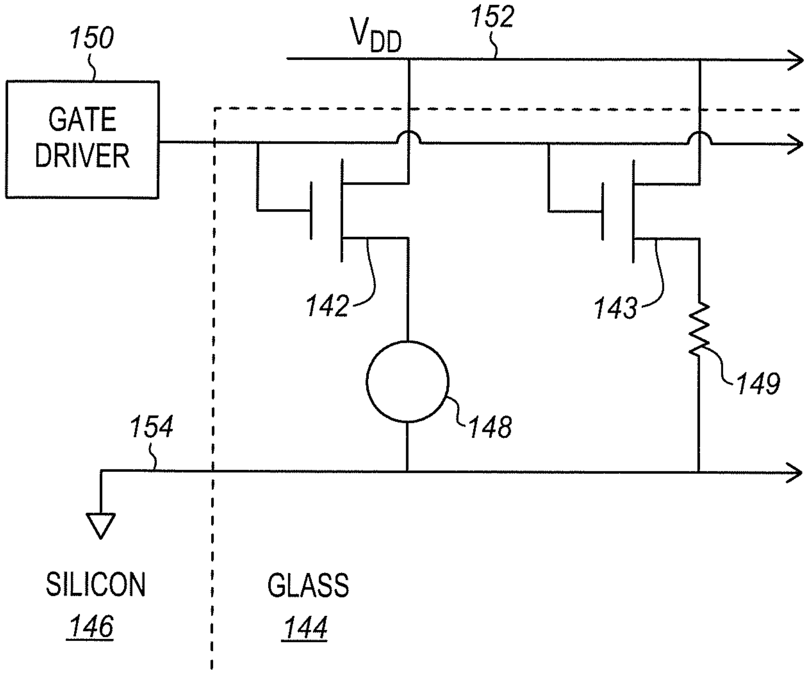
FIG. 8 is a combined block diagram and circuit schematic of a display element array system in accordance with an embodiment of the invention.

FIG. 8 shows an application of the test apparatus of FIG. 6 to characterize display circuitry on a glass substrate. Two transistors 142, 143 are shown although there may be many more, typically millions of transistors, depending on the particular display system. The transistors may be formed on a glass substrate 144 for improved packaging and efficiency. The first transistor drives a pixel element 148 of the display. The pixel element may be a liquid crystal element, a diode, or any other type of local display element. The second transistor 143 is a replica transistor used for characterizing the behavior of the first transistor 142 without affecting the use of the display. The second transistor 143 drives a resistor 149 or any other load that has similar characteristics to a pixel element for the particular display. In some cases, a capacitor may more closely resemble the characteristics of a liquid crystal capacitor of a display element. The first transistor can be referred to as the original transistor and the second transistor as the replica transistor because its characterization is used as a characterization of the original transistor.

Both resistors are coupled to a supply voltage $V_{DD}$ rail 152 and to a common or ground rail 154. A gate driver 150 drives the gates of both transistors. The first, original transistor 142 is driven to produce the intended images on the display. The second, replica transistor 143 is driven to emulate the behavior and load that is experienced by a particular display transistor, such as the first transistor 142. As the display transistor 142 ages with time and use, the replica transistor 143 will also age in a similar way. By characterizing the replica transistor, the system is able to closely approximate the characteristics of the original or display transistor. The gate driver circuit 150 has a compensation facility (a circuit) to allow it to compensate for the effects of wear, use, and environmental exposure. The compensation facility may include a set of configurable parameters to adjust various voltages or it may be a simpler or more complex structure depending upon the design of the gate driver.

As shown in FIG. 8, the first and second transistors 142, 143 and the loads are all formed on the glass substrate 144. As a result, the two transistors may be made similar in structure and materials and exposed to the same environment. The replica transistor may be formed on a part of the glass substrate that is not visible to the user. Typically, is not necessary for the replica transistor to be exposed to the backlight for displays that use a backlight. As a result, the replica transistor may be placed in a location that is not used for the visible display to the user.

Alternatively, since a single replica transistor 143 and its load are very small, it may be possible to place it in the midst of the display without being noticed by a user. Note that while the actual load 149 for the replica transistor may be formed on the glass substrate 144 for compactness or to replicate the electrical leads of the first transistor. It may alternatively be formed on silicon for reliability or accuracy, depending on the form of the load. The supply voltage, the ground, and the gate driver may all be formed on a silicon substrate 146. This silicon substrate may be formed on the glass substrate 144 or it may be formed in a separate location.

While only two transistors are shown, this is in order to simplify the drawing. For each transistor type that is formed on the glass substrate, there may be one or more replica transistors that replicate the structure and duty cycle of that transistor. As each different type of transistor is characterized the supply voltage and gate driver signal can be adjusted for that particular transistor type using, for example, a compensation facility of the gate driver or another approach.

As an alternative to the common gate driver shown in FIG. 8, the replica transistor may have its own gate driver or it may receive gate signals from the gate driver that are specifically intended to represent a normal duty cycle for a transistor of its type.

Figure 9:
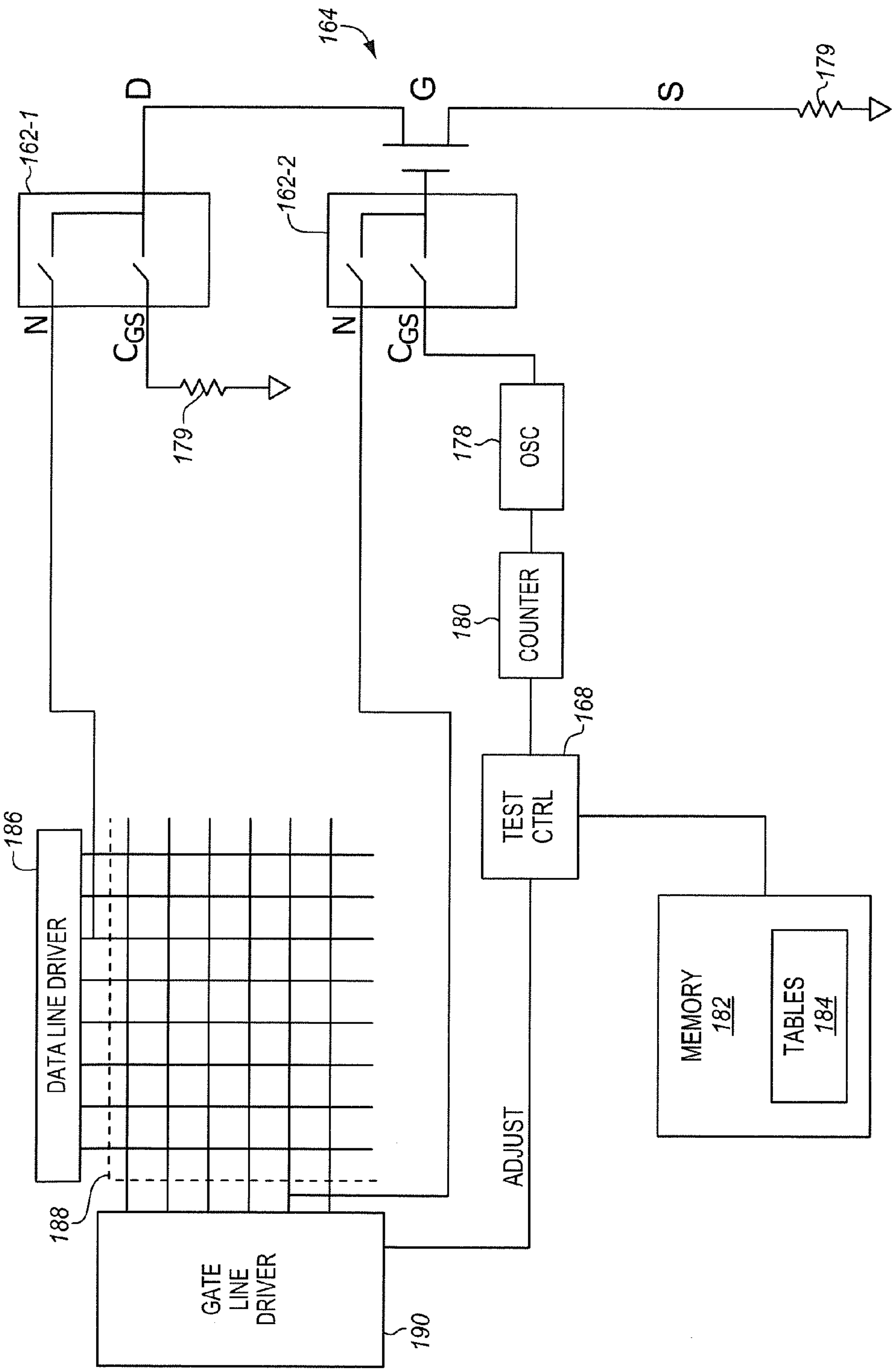
FIG. 9 is a combined block diagram and circuit schematic of a display element array test system in accordance with an embodiment of the invention.

FIG. 9 shows an example of the replica transistor 164 coupled to test hardware. As in FIG. 8, the test hardware may be on a silicon substrate while the replica 164 and, optionally, a load 179 are on the glass substrate. The source of the replica transistor is coupled to a multiplexor 162-1 that has two or more different inputs. In the illustrated example, the multiplexor has a normal N input and a gate source capacitance $C_{GS}$ input. The inputs are selected by a test controller 168 and are coupled by an output to the drain D of the replica transistor 164. This allows the replica transistor to be operated normally, to emulate an original transistor as shown in FIG. 8, or in a test mode as shown in FIG. 6. In this particular example, for the first mode, normal operation, the replica transistor's drain D is coupled to a data line driver 186 of a display 188. This allows the replica transistor 164 to be driven in the same way as an original or display transistor (not shown). The display 188 is an LCD or OLED display as described above with millions of pixels, each controlled by the data line driver 186 and a gate line driver 190.

For the second mode, $C_{GS}$, the drain is coupled to the ground through a load 179. This provides the connection for the drain to render the replica transistor 164 as a capacitor of the type shown in FIG. 7B. Other connections may be provided if a different type of capacitor is to be used in the ring oscillator test circuit.

Similarly, a second multiplexor 162-2 also allows two different connections to be made to the gate G to support the normal and test modes discussed above. A normal connection N allows for normal operation of the transistor to emulate typical operation of transistors of this type in operation on the display. The gate line driver 190 of the display 188 is coupled to the display transistors and also to the gate of the replica transistor 164.

The second connection $C_{GS}$ provides the equipment suitable for a ring oscillation frequency test as shown in FIG. 6. For simplicity, a ring oscillator is shown as being coupled generally to the gate of the replica transistor 164. The specific details of this connection are shown in FIGS. 6 and 7B. With the ring oscillator coupled to the replica transistor the frequency can be measured using a counter 180 and frequency measurement block. In the illustrated example, the frequency measurement is performed within the test controller 168, however, it may be provided in a discrete component instead.

The source S is coupled to ground through the load 179 for all modes. A resistive load is shown, however, a capacitive load that simulates the load of the liquid crystal capacitor of a display pixel may be used instead. Alternatively, a third multiplexor may be used to switch between resistive and capacitive loads, depending on the particular implementation.

The multiplexors 162-1, 162-2 are connected together or, alternatively, may be coupled to a common test controller 168. The test controller controls the operational mode of the replica transistor 164 by controlling the operation of the multiplexors as well as the operation of the ring oscillator and the switches which connect and disconnect the replica transistor from the oscillation ring.

The test controller 168 is coupled to a memory 182 in which a table is stored 184. This memory may be used for instruction sequences, interrupts, and parameters. The table of the memory may also be used to store the test results that characterize the replica transistor. This or another controller may then use these test results to determine operational parameter adjustments for the transistors of the display 188. The measurement values stored in the table may be actual frequency measurements made under different circumstances or an indication of these measurements. The test controller may pre-process the measurements in any of a variety of ways. In one example, the table is used only to store adjustment parameters for the gate line driver. These adjustment parameters are an indication of the current measurements in that they are derived using the current measurements.

The test controller 168 is coupled to the gate line driver 190 in order to make these adjustments. As the parameters for operation of the display transistors are adjusted, the same adjustment may be made for the operation of the corresponding replica or dummy transistors 164. The adjustments may include changing the drain voltage supplied to particular transistors or on a voltage rail and changing the voltage applied by a gate driver to one or more of the display transistors. This adjustment may be made by the test controller to the voltage supply and gate driver circuitry or another device can access the parameters in the table 184 to make the adjustments.

The relationship between the measured frequencies at the ring oscillator and the adjustment parameters may be determined theoretically or empirically. The capacitance of the replica transistor causes the ring oscillator frequency to change. This capacitance is related to the threshold voltage of the transistor. The change in the gate source capacitance from its original value can then be used to determine how to adjust the operation of the display. Due to the many variables of fabrication and composition of the transistors in the display, the ring oscillator and the replica, instead of theoretical mathematical relationships, a look up table can be established empirically. A test display from the same batch may be tested, calibrated and exercised and empirical relationships between oscillation frequency and adjustment parameters may be stored in a look up table to directly produce an adjustment parameter using a frequency or counter value. If the look-up table stores counter values, then the frequency measurement 120 may be removed. The system can then operate using only the counted number of state changes over a particular clocked time period.

Figure 10:
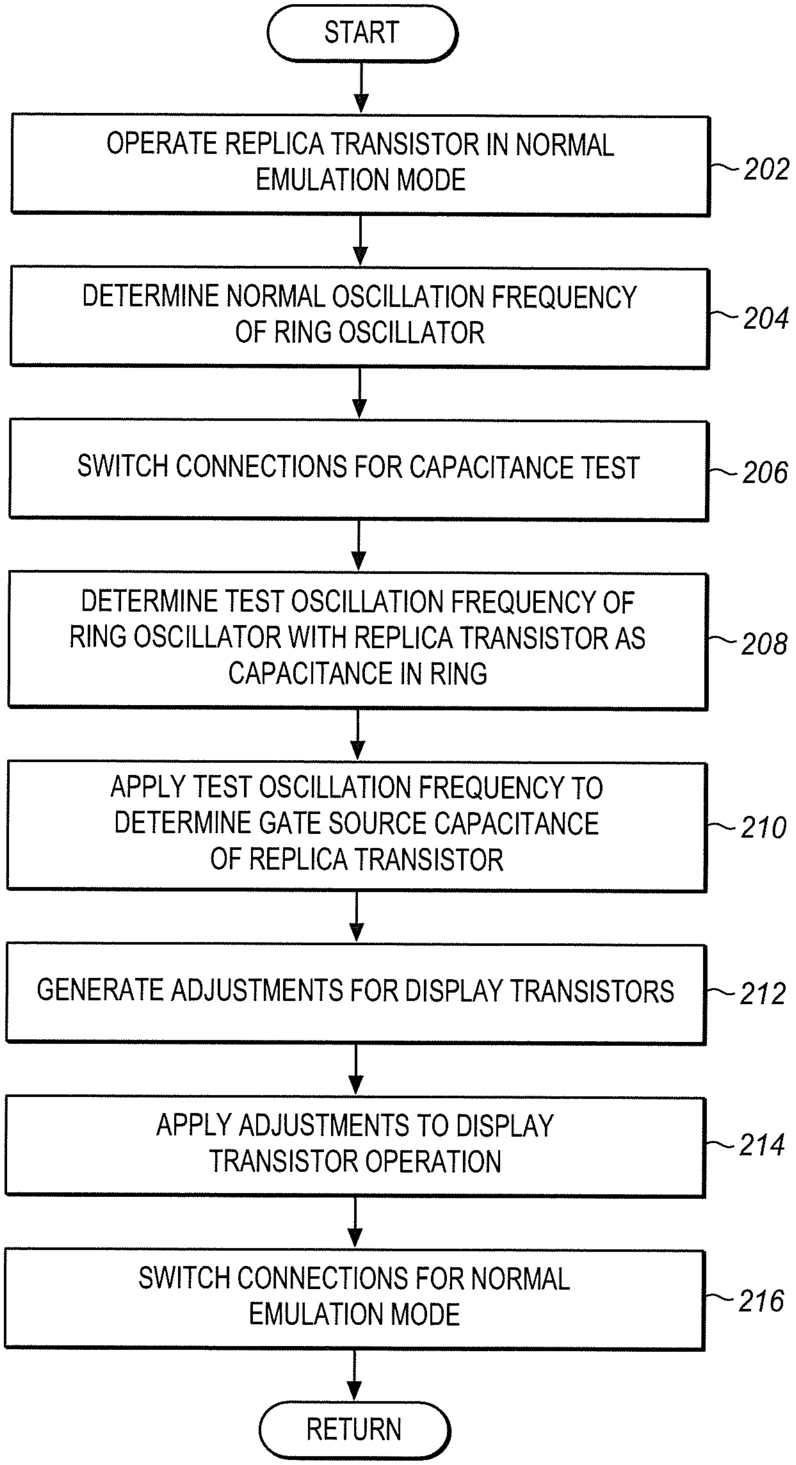
FIG. 10 is a process flow diagram of testing a replica circuit for gate source capacitance in accordance with an embodiment of the invention.

FIG. 10 is a process flow diagram for adjusting the operation parameters of a display using a threshold voltage test. The process may run at all times that the display is operated. The process starts when the display is brought into use, such as at power on of the attached device. At 202 the replica transistor is operated in normal emulation mode. As mentioned above, in this mode the replica transistor drives its load based on gate driver inputs in a way that emulates a typical duty cycle or operation of the original or display transistors that are used to generate images for the users. The replica transistor is operated on the display substrate in the normal mode to emulate the operation of an original transistor also formed on the display substrate. The original transistor is a constituent part of one of a plurality of pixels, gate line drivers, and data line drivers. One or all of the gate line driver and the data line driver can be driven by a transistor drive circuit;

At 204, the normal oscillation frequency of a ring oscillator circuit is determined. The ring oscillator circuit has an oscillation ring with a series of inverters or other logic delay gates.

At 206, the connections to the replica transistor are switched using, for example, the multiplexors shown in FIG. 9 in order to start a gate source capacitance test. The gate source capacitance test can be performed in any of a variety of different ways. In one example, at 208 the test oscillation frequency of the ring oscillator is determined with the replica transistor acting as a capacitor connected to the oscillation ring. At 210 the test oscillation frequency or a comparison of the test oscillation frequency to the normal oscillation frequency is applied to determine the gate source capacitance of the replica transistor. This may be done using look up tables or by calculations. Instead of a specific threshold voltage in units of volts, the gate source capacitance may be indicated by a scaled value or some other indication.

At 212 the test results are accessed in order to generate adjustments to be applied to the transistors of which the replica transistor is a replica. A primary type of transistor is a display transistor but replicas can be made that allow other types of transistors to be characterized as well. The test results stored in memory characterize the gate source capacitance of the replica transistor based on the frequency measurements. The adjustments based on the replica transistor behavior represent a similarity to the characteristics of the display transistors. At 214 these adjustments are applied to the operation of the display transistors. The process flow then returns to the start with the replica transistor being operated in a way to emulate the operation of the display transistors.

At 216, the connections for the replica transistor are switched back to normal emulation mode. The replica transistor is disconnected from the ring oscillation test circuit and reconnected to the gate line and data line drivers. This may be done immediately after the frequency determination or at a later time, depending on the implementation.

The frequency tests can be triggered based on a clock or an event. The tests may be performed after a certain number of hours or days of operation, on power up, upon entering standby, etc. While only a gate source capacitance test is described other and additional tests may be performed. Both of the ring oscillator frequency measurements may be performed in sequence before switching the connections back to normal emulation mode.

A similar process may be used more generally to determine the gate source capacitance of a transistor using a ring oscillation circuit. First, a normal oscillation frequency of an oscillation ring of a ring oscillator test circuit is determined. Second, a transistor to be measured is connected to the oscillation ring of the ring oscillator test circuit as a capacitor at the ring output. Third, a test oscillation frequency of the ring oscillator test circuit with the replica transistor connected to the oscillation ring is determined. Fourth, the normal oscillation frequency and the test oscillation frequency are compared to determine a contribution of the transistor to be tested. Finally, the comparison is applied to determine the gate source capacitance of the transistor. A look up table of empirically determined gate source capacitance values may be used or the values may be determined directly.

While the transistors in the figures are shown as n-type MOSFETs (Metal Oxide Semiconductor Field Effect Transistors), similar approaches may be used with p-type MOSFETs and with other types of transistors. The techniques described herein may be adapted also to suit a variety of different types of substrates for the display, both transparent such as glass and opaque, whether plastic, glass, or another silicon-based material.

While the original transistor shown, for example, in FIG. 8 is a display TFT, the same approach may be applied to other types of transistors. In Gate on Array technology, other transistors, including gate driver transistors may be fabricate on a glass or other transparent substrate. Alternatively, the original transistor may be a different TFT, such as a part of a multiplexor or demultiplexor circuit or a data line driver. A replica transistor may be provided to emulate the operation conditions of any of these other transistors.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although the switch element shown in FIG. 9 is an n-channel field effect transistor whose gate is coupled to a gate line and whose drain is coupled to a data line, the gate driver circuitry may also work for driving other types of switch elements, including ones that may have more complex designs such as multiple transistors, or ones with a more simple design such as a single diode. The description is thus to be regarded as illustrative instead of limiting.

What is claimed is:

1. A display system comprising:

a display substrate having formed thereon a plurality of pixels, gate line drivers, and data line drivers, wherein the pixels and the gate and data line drivers have an original transistor formed on the substrate, the original transistor being a constituent part of one of the pixels, at least one of the gate line driver and the data line driver being driven by a transistor drive circuit;

a replica transistor formed on the substrate that is a replica of the original transistor and is coupled to be driven so as to emulate the original transistor;

a ring oscillator test circuit having a ring of inverters coupled to the replica transistor to produce an oscillation frequency with and without the replica transistor coupled to the oscillator ring;

a frequency measurement circuit to measure the frequency of the ring oscillator circuit with and without the replica transistor coupled to the oscillator ring to determine an indication of the threshold voltage of the replica transistor based on the measured frequency; and a compensation facility in the transistor drive circuit to adjust the voltage applied to the original transistor based on the replica transistor threshold voltage.

2. The display system of claim 1, wherein the ring oscillator test circuit is coupled to the replica transistor such that the replica transistor forms a capacitor coupled to the output of the oscillation ring.

3. The display system of claim 2, wherein the replica transistor in a test mode is coupled to the ring output at its gate and to ground at its source and drain.

4. The display of claim 1, further comprising a multiplexor coupled to the replica transistor at an output and the transistor drive circuit and the ring oscillator test circuit at an input to alternately connect the replica transistor to the transistor drive circuit and the ring oscillator test circuit.

5. The display of claim 4, the multiplexor comprising an output coupled to a drain of the replica transistor to alternately connect a data line drive voltage and a ground to the replica transistor.

6. The display of claim 4, the multiplexor comprising an output coupled to the gate of the transistor to alternately connect a gate driver to emulate normal operation and the ring oscillator test circuit to test gate source capacitance of the replica transistor.

7. The display of claim 1, wherein the transistor drive circuit comprises a gate driver and wherein the compensation facility comprises parameter settings in the gate driver.

8. The display of claim 1, wherein the display substrate is formed of glass.

9. The display of claim 1, wherein the transistor drive circuit and the ring oscillator test circuit are formed on a silicon substrate.

10. The display of claim 9, wherein the silicon substrate is formed on the display substrate.

11. A method comprising:

operating a replica transistor on a display substrate in a normal mode to emulate the operation of an original transistor also formed on the display substrate, wherein the original transistor is a constituent part of one of a plurality of pixels, gate line drivers, and data line drivers, at least one of the gate line driver and the data line driver being driven by a transistor drive circuit;

determining a normal oscillation frequency of a ring oscillator test circuit;

connecting the replica transistor to an oscillation ring of the ring oscillator test circuit;

determining a test oscillation frequency of the ring oscillator test circuit with the replica transistor connected to the oscillation ring;

generating adjustments for the original transistor using the determined test oscillation frequency;

applying the generated adjustments to the original transistor; and disconnecting the replica transistor from the ring oscillation test circuit and connecting the replica transistor to emulate the operation of the original transistor.

12. The method of claim 11, wherein connecting the replica comprises connecting the replica transistor as a capacitor to the output of the oscillation ring.

13. The method of claim 11, wherein generating adjustments comprises determining a gate source capacitance of the replica transistor using the frequency measurements and using the gate source capacitance generate the adjustments.

14. The method of claim 11, further comprising:

storing a representation of the determined test oscillation frequency in a memory; and adjusting parameters of the transistor drive circuit based on the stored measurement frequency.

15. The method of claim 12, wherein generating adjustments comprises applying the determined test oscillation frequency to a look up table to determine a gate driver voltage adjustment.

16. The method of claim 12, wherein the original transistor is a display transistor.

17. A method of determining a gate source capacitance of a transistor comprising:

determining a normal oscillation frequency of an oscillation ring of a ring oscillator test circuit;

connecting the transistor to the output of an oscillation ring of the ring oscillator test circuit as a capacitance;

determining a test oscillation frequency of the ring oscillator test circuit with the transistor connected to the oscillation ring;

comparing the normal oscillation frequency and the test oscillation frequency to determine a contribution of the transistor;

applying the comparison to determine the gate source capacitance of the transistor.

18. The method of claim 17, wherein applying the comparison comprises applying the comparison to a look up table of empirically determined gate source capacitance values.

* * * * *